May 11, 1971 E. PAMMER ET AL 3,578,495

METHOD OF PRECIPITATING INSULATING PROTECTIVE LAYERS COMPRISED OF INORGANIC MATERIAL UPON THE SURFACES OF SEMICONDUCTOR WAFERS

Filed Jan. 13, 1969

United States Patent Office 3,578,495

Patented May 11, 1971

3,578,495
METHOD OF PRECIPITATING INSULATING PROTECTIVE LAYERS COMPRISED OF INORGANIC MATERIAL UPON THE SURFACES OF SEMICONDUCTOR WAFERS

Erich Pammer, Munich, and Helmuth Kirschner, Unterhaching, Germany, assignors to Siemens Aktiengesellschaft, Berlin and Munich, Germany Filed Jan. 13, 1969, Ser. No. 790,725
Claims priority, application Germany, Jan. 15, 1968, S 113,723
Int. Cl. H011 7/36
U.S. Cl. 117—201 9 Claims

ABSTRACT OF THE DISCLOSURE

Described is a method of precipitating insulating protective layers of inorganic material at the surface of heated semiconductor wafers from a reaction gas which precipitates the material. The wafers are heated by the reaction chamber wall, comprised of highly pure quartz or similar material. The method is characterized in that the reaction gas which is introduced into the reaction chamber fresh and having a temperature of at least 100° C. below the semiconductor wafers to be coated, is directed by at least one impediment positioned along its path toward the semiconductor wafers to be coated, radially toward the wall of the reaction chamber which has a temperature of at most 50° C. below the temperature of the semiconductor wafers to be coated and then passes quickly to the semiconductor wafers which are located at a distance behind said impediment, that in spite of the now high temperatures of the reaction gas, precipitation takes place only at the location of the seimconductor wafers.

Figure 1:
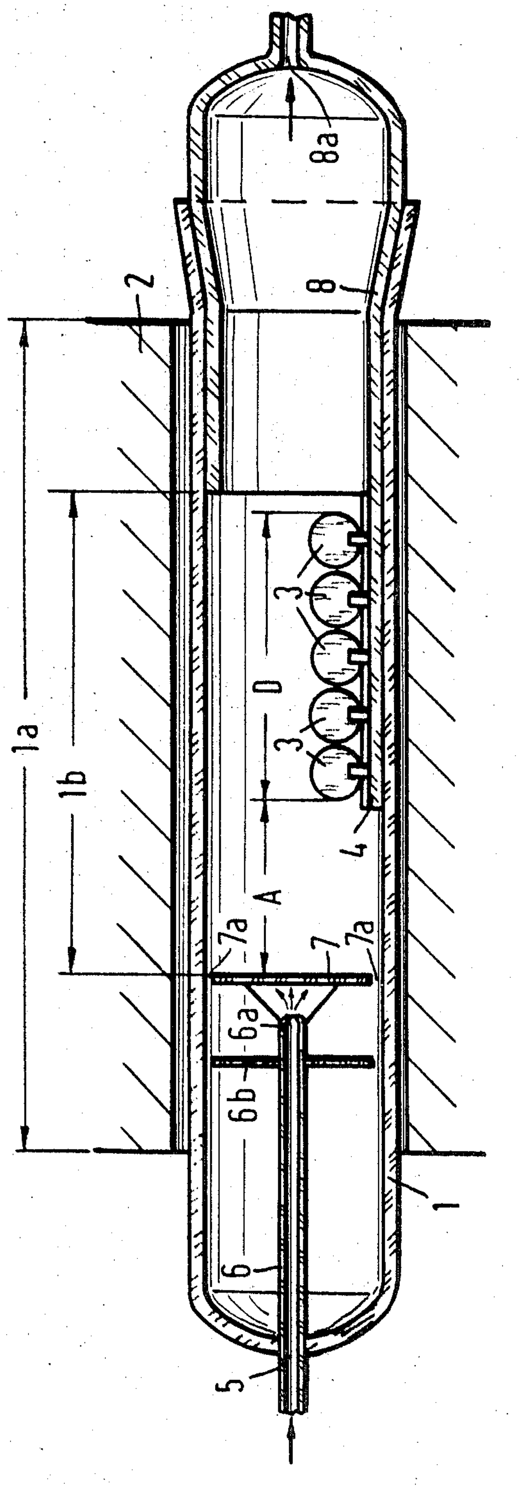

It is customary to provide the surface of semiconductor structural components with a thin protective layer of silicon oxide or silicon nitride. Frequently, the protective layer is needed even during the production of the semiconductor component, for example when using the so-called planar method, in order to afford a localized indiffusion of doping materials from the gaseous phase into the semiconductor crystal. These layers, under conditions used in the semiconductor art for diffusion processes from a gaseous phase, are known to be impermeable to a number of conventional dopants. Consequently these protective layers are used as maskings.

In addition to the possibility of producing such protective layers under the direct action of oxidizing, or nitriding, substances, it is also customary to precipitate these materials upon the heated surface of the semiconductor crystals from a reaction gas with which the crystals were brought into contact. This method is preferred in many instances other than when the protective layer cannot be produced by means of oxidation or by other means which effect a chemical conversion at the surface of the original semiconductor material. The reason for this preference lies, last but not least, in the fact that such reaction gases often supply at specially low temperatures a protective layer which meets the requirements in the fullest sense and is absolutely preferred in semiconductor wafers wherein one portion of the p-n junctions had already been produced or where other production steps had already been taken.

Thus, $SiO_2$ layers may be obtained through thermal dissociation of silicic acid esters. Application Ser. No. 634,-614, filed Apr. 28, 1967 (F–3583), of E. Pammer and H. Panholzer, discloses a method for producing a protective layer from a silicon or germanium nitride compound, on the surface of a semiconductor crystal of this type which is characterized by the use of a reaction gas that contains, as an active component, a metal-free, volatile compound of nitrogen and the semiconductor.

Application Ser. No. 712,825, filed Mar. 13, 1968 of E. Pammer discloses a method for producing a protective layer, comprised partly of silicon oxide, partly of silicon nitride, on the surface of a semiconductor body. Both layer portions are arranged at the surface of the semiconductor crystal, directly superimposed, by precipitating the protective layer materials fom the gaseous phase. This method provides that during the entire precipitation process, a reaction gas is employed which is able to precipitate silicon nitride. During a part of the precipitation process, this reaction gas is admixed with a reaction gas which can precipitate oxygen at such concentrations that at least one coherent layer of silicon oxide is precipitated in addition to at least one coherent layer of silicon nitride, at the same place of the semiconductor surface.

In addition to the production of such protective layers, the present invention is also of value for the production of epitactic semiconductor layers, wherein semiconductor material is precipitated at the surface of a semiconductor disc, from a gaseous phase. For technical reasons, the apparatus used in such processes is preferably comprised of a horizontal quartz tube arranged in a tubular furnace. The reaction gas is introduced at one end of the quartz tube and flows across the semiconductor wafers, positioned in the quartz reaction tube and heated through contact with the wall thereof, and delivers the respective precipitation material prior to leaving the reaction tube at the other end. In this case, it is usually difficult to realize a homogeneous coating of the semiconductor discs due to the fact that the reaction gas often dissociates prematurely and the content of material to be precipitated is already exhausted at the location of the semiconductor wafers to be coated. It is an object of the present invention to remedy this disadvantage.

The invention relates to a method for precipitating insulating protective layers of inorganic material, upon the surface of heated semiconductor wafers, from a reaction gas which precipitates the material. The gas flows with particular turbulence around the semiconductor wafers to be coated. The semiconductor wafers are heated by the wall of the reaction chamber, which is comprised of highly pure quartz or the like. To this end, we guide the reaction gas, which is introduced into the reaction chamber fresh and still at least 100° C. below the temperature of the wafers to be coated, through at least one impediment, arranged along its path toward the semiconductor wafers to be coated, in radial direction toward the wall of the reaction chamber. The wall is at most 50° C. below the temperature of the semiconductor wafers to be coated. The reaction gas is quickly supplied therefrom to the semiconductor wafers, which are located at a distance behind the impediment, so that in spite of the now high temperature of the reaction gas, the precipitation process begins at the locality of the semiconductor wafers.

To illustrate the invention, we shall refer to the device for performing the method of the invention, shown in FIG. 1.

The reaction vessel is comprised of a horizontally positioned quartz tube 1, the middle portion 1*a* of which is located in tubular furnace 2 and is heated to the required reaction temperature through the action of said furnace. The hottest region 1*b* of the reaction chamber contains the wafers 3, comprised of silicon which are to be coated. The wafers are heated by thermal conduction or convection of the reaction gas, with the aid of the wall of the reaction vessel 1. A further development is a substrate 4 which is comprised of heat-conducting material, such as quartz, wherein the wafers to be coated are supported in a known manner. The fresh reaction gas enters the reaction chamber, for example from the left at location 5. For this purpose, a pipe 6 which supplies the reaction gas, extends into the reaction chamber so far that its outlet 6a is located approximately at the beginning of the hottest zone 1b. The supply pipe 6 preferably ends inside a nozzle. The gas-carrying pipe 6 is kept at the greatest possible distance from the wall of the reaction pipe 1 (i.e. in the middle of the pipe) in order to avoid overheating. The aim is to keep the reaction gas within the supply pipe 6, still far below the reaction temperature. Due to this arrangement, the reaction gas flows horizontally and along the central axis of the reaction chamber, from the supply pipe 6 and reaches, immediately after leaving the supply pipe, a flow-impediment which is designed as a baffle plate 7 and comprised of quartz and which diverts the fresh reaction gas steadily radial to the outside, so that at this point the fresh reaction gas establishes contact with the wall of the reaction chamber which is almost at reaction temperature, i.e. the temperature of the semiconductor wafers to be coated. The distance between the baffle plate 7 and the reaction chamber wall is so slight that, due to the enforced contact with the very hot pipe wall, the reaction gas is heated almost instantly to reaction temperature and is activated thereby. In order to prevent precipitation at this locality, a high velocity is given to the reaction gas, so that the prepicitation becomes feasibile only when the fresh reaction gas reaches the location of the wafers 3, in portion 1b of the reaction chamber.

To coat with $SiO_2$, we use a reaction gas, preferably a silicic acid ester, for example tetraethoxysilane, mixed with an inert gas such as nitrogen or argon. As soon as said reaction gas is led past the action of the baffle plate, toward the hot wall of the reaction chamber, the reaction gas is activated. After activation a finite time is necessary, however, before one sees the first traces of precipitation. This time is utilized to prevent precipitation immediately behind the baffle plate. When the velocity of the reaction gas is sufficiently high, the portions of the reaction-tube tube wall, located between the baffle plate 7 and the semiconductor wafers 3, will not be subjected to precipitation, since the reaction mechanism requires the same amount of time to complete precipitation as that required for the reaction gas to travel from the baffle plate 7 to the wafers 3.

Since, as previously mentioned each chemical reaction requires a finite amount of time, it must also be concluded that a finite time passes until, following the creation of conditions needed for the reaction process, the product which results from said reaction appears in appreciable amounts. It is apparent that in the method of the present invention the conditions necessary for reaction are adjusted very suddenly, i.e. when due to the effect at the baffle plate, the reaction gas reaches the hot wall of the reaction chamber. Some time elapses until the first traces of precipitation become noticeable, so that a certain area behind the baffle plate 7 is still free from precipitation. It is the object of the invention to ensure that the region, indicated as A in FIG. 1, between the baffle plate 7 and the first of the wafers 3 to be precipitated, will not produce any precipitation but that the precipitation will set in exactly at the location of the first wafer. Since the time lapse $t$, between the establishment of reaction conditions up to the appearance of the first precipitation, is very short, it is necessary to work with considerable flow velocities of the gas in order to make sure that no precipitation will occur in a distance A which is several centimeters long.

If $t$ is known, then $t$, the length of the distance A, and the flow velocity $v$ of the reaction gas are inter-related by the equation:

$$A=v\cdot t$$

The delay period $t$ is a function of the temperature T of the respective portion of the reaction chamber and depends also upon the type of reaction. The value of $t$ must be established either empirically or theoretically. For an empiric calculation, the reaction gas will be suddenly heated to the desired temperature during a test and then be guided at a known velocity $v'$ along a plane suitable for precipitation, e.g. comprised of quartz and maintained at said temperature T (which corresponds to the temperature at the location of the discs). Analytic tests, which are conducted in a known manner, show that distance from the start of the precipitation path at which precipitation becomes noticeable. This distance has the values A' and $t$ is then obviously obtained through the equation:

$$t=A'/v'$$

For example, when using tetraethoxysilane and inert gas, e.g. nitrogen, as a reaction gas, and at a reaction temperature T of 600 to 700° C., a value for the delay period $t=100$ to 200 seconds is established. If the path A is selected between 15 to 35 cm., the reaction velocity should be at least 3.5 to 5 m./min.

The dimension D of two silicon wafers 3, located in the direction of the flow of reaction gas, is dimensioned according to other viewpoints. Depending on the quality and productivity of the reaction gas, an exhaustion of the precipitation becomes noticeable after some time. This is taken into account by selecting a distance D which is not too long. For a precipitation temperature T=600 to 700° C., D should not be longer than 20 cm.

Since it is a function of the baffle plate 7 to force the gas through a narrow gap 7a between the hot wall of the reaction tube 1 and the baffle plate 7, it becomes clear that the distance between the baffle plate and the wall of the reaction tube must not be too great. It is preferable that the space between the baffle plate and the inner wall of the reaction chamber not be larger, at any location, than 5 to 10% of the inner diameter of the reaction tube, measured at the same locality, so that at any rate, a quick and thorough heating of the reaction gas will be ensured by the narrowness of the channel or channels. Also, the narrow channel 7a largely prevents a rediffusion of components from the reaction chamber into the portion of the baffle plate. Furthermore, as seen in FIG. 1, a diaphragm 6b is provided in the vicinity of the opening 6a of the supply pipe and ensuring, if possible, that the entire reaction gas is guided in the direction toward the baffle plate and the wafers 3 to be coated. If necessary, this diaphragm may completely seal off the reaction chamber.

Experience has shown that the precipitation of $SiO_2$ is not limited to the hotter portions of the reaction apparatus and the wafers to be coated, but takes place to a considerable degree at colder places of the reaction vessel wall. These precipitations, however, are known to be loose and not dense and can easily become peeled off from the precipitation substrate, e.g. the wall of the reaction vessel. When the wafers to be coated are inserted, these soft precipitates may fall upon the wafers contaminating the surface thereof, resulting in an adverse effect in the quality of the protective layers, to be produced. In order to avoid this disadvantage, we recommend the use of a quartz wafer support which continues beyond the end of the reaction tube in a tubular portion 8 and constitutes the closure of the reaction tube and the outlet 8a for the exhausted reaction gas through which all the reaction gas must flow. Precipitation of loose $SiO_2$, which sets in below approximately 500° C., can be limited to the tubular support by appropriate heating.

In any event, precipitation must be avoided at the wall of the reaction vessel at the location of the semiconductor wafers to be coated. The support portion is removed together with the support structure, after each charge of semiconductor crystals, preferably with a flowing reaction gas. Prior to each new loading of the support structure, the $SiO_2$ precipitations may be removed in a known manner, for example by etching with hydrofluoric acid. The $SiO_2$ which may be precipitated at hotter portions of the wall of the reaction tube adheres, however, and does not result in the aforedescribed disturbance. A constant removal of such precipitation is not required.

The supply pipe 6 may have double walls, so that a coolant or a cooling gas may pass therebetween. Another embodiment is to evacuate the space between the two walls and to seal it whereby the reaction gas can be kept cool within the supply pipe, i.e. virtually at room temperature.

The baffle plate may be substituted by differently formed resistance bodies. Curved or cup-shaped resistance bodies are feasible. The baffle plate or the resistance body may be held by the supply pipe 6. The baffle plate or the other resistance body can be tightly connected with the wall of the reaction tube. In this case, it is sufficient to design the baffle plate 7 as a separating wall, perforated at the edge. The holes are preferably arranged in symmetry.

Figure 3:
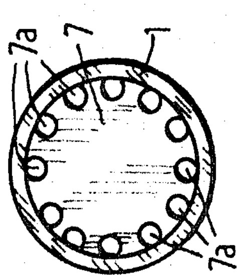
Figure 2:
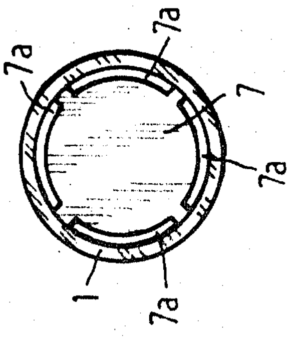

FIGS. 2 and 3 illustrate two embodiments of such baffle plates in top view. The various features are indicated as above. Finally, the support structure 8 may have several layers for storing the semiconductor wafers 3. The support structure is so designed that it snuggles against the inside wall of the quartz tube in order to promote a good heat transfer.

An additional security for preventing precipitations of porous $SiO_2$ outside the reaction zone 1*b* may be obtained by a flow of inert gas which additionally rinses the cooler parts of the tubular wall.

The same problems occur during production of silicon nitride layers from the gaseous phase. This is also the case during the production of aluminum oxide from a reaction gas which contains, for example, aluminumtetraethylester. In all these and similar instances, the invention brings good results. The above disclosed considerations as well as the disclosed device can therefore be directly applied.

Generally, when using the method of the present invention, the active components of the reaction gas will be so strongly diluted with inert gas or with hydrogen and/or the temperature conditions will be so selected that precipitation in the free gas phase will not be possible. Thus, the wafers to be coated and, to a somewhat lesser degree, the wall of the reaction tube, play a decisive part as the precipitation substrate. Two phases occur:

(1) The activating phase: this occurs as soon as the reaction gas becomes heated as a result of the first contact with the hot wall of the reaction tube.

(2) The precipitating phase: the energy-rich radicals or other molecule fractions which are formed during the first phase, react during this phase thereby forming the desired protective layer material, for example $SiO_2$ or $Si_3N_4$.

Often, heat must be removed which according to the conditions is possible only via the nonreacting portions of the reaction gas or the also hot wall of the reaction tube. To promote a thorough activation of the reaction gas, it is preferred that the temperature at the wall of the reaction vessel, in the vicinity of the baffle plate 7, is higher than the temperature of the semiconductor wafers to be coated. In case of an esterpyrolysis which was described in a foregoing embodiment, the temperature difference by which the wall is hotter at the baffle plate than at the location of the wafers to be coated, is 20° C. and more.

During a run, the reaction tube had an inner diameter of about 50 mm. and a temperature of 600 to 700°, at the location of the baffle plate and the wafers. Using a flow velocity of at least 3 m./minute (approximately 10 liters/minute) for the gas, a distance of 25 cm. remained behind the baffle plate, at 5 m./minute, and a distance A of 30 cm. remained free of precipitation, when $SiO_2$ layers were precipitated from a gas-containing silicaester. At a precipitation of $Si_3N_4$, corresponding conditions resulted in a somewhat smaller, i.e. 5 to 15 cm. long, precipitation-free region. The temperatures were increased, however, by approximately 100° C.

We claim:

1. A method of precipitating insulating protective layers of inorganic material at the surface of heated semiconductor wafers from a reaction gas which precipitates the material, whereby the wafers are heated by the reaction chamber wall, comprised of highly pure quartz or similar material, wherein the reaction gas is introduced into the reaction chamber fresh and having a temperature of at least 100° C. below the semiconductor wafers to be coated, encounters at least one impediment positioned along its path toward the semiconductor wafers to be coated, which directs its flow radially toward the wall of the reaction chamber which has a temperature of a maximum of 50° C. below the temperature of the semiconductor wafers to be coated and from there passes quickly to the semiconductor wafers which are located at a distance behind said impediment, so that in spite of the now high temperatures of the reaction gas, precipitation takes place only at the location of the semiconductor wafers.

2. The method of claim 1, wherein the high velocity of the reaction gas is produced by discharging the gas through a nozzle directed toward the impediment.

3. The method of claim 1, wherein the wafers to be coated are arranged on a quartz support structure which extends, in the flow direction, into a tubular portion which constitutes the outlet for the entire reaction gas from the reaction vessel.

4. The method of claim 3, wherein the active component of the reaction gas is so strongly diluted that precipitation is possible at the heated surface and impossible in the free gas phase.

5. The method of claim 4, wherein the supply for the fresh reaction gas is additionally cooled.

6. The method of claim 5, wherein the wall locations toward which the reaction gas is first of all guided, are kept at a higher temperature than the wafers to be coated.

7. The method of claim 3, wherein the temperature conditions are so adjusted at the wall of the reaction tube that loose precipitations can form only inside the tubular support portion.

8. A device for carrying out the method of claim 1, which comprises a reaction vessel comprised of quartz or the like, a supply pipe for the fresh reaction gas protruding from outside into one end of said reaction vessel, the outlet opening of said supply pipe being directed toward a flow impediment which is arranged at least partly at a distance from the tubular wall.

9. The device of claim 8, wherein the wafers to be coated are arranged on a carrier which, in the direction of the flow of the reaction gas, is integral with a tubular portion arranged at the inside wall of the tube which forms the exit for the entire reaction gas from the reaction vessel and which fits gas-tightly against the inner wall of the tubular reaction vessel.

References Cited

UNITED STATES PATENTS 3,017,251 1/1962 Kelemen ---------- 23—223.5

WILLIAM L. JARVIS, Primary Examiner

U.S. Cl. X.R.

117—106; 148—175; 118—48, 49.5